United States Patent
Yang et al.

(10) Patent No.: US 8,207,520 B2
(45) Date of Patent: Jun. 26, 2012

(54) PROGRAMMABLE CROSSPOINT DEVICE WITH AN INTEGRAL DIODE

(75) Inventors: Jianhua Yang, Palo Alto, CA (US); Gilberto Medeiros Ribeiro, Menlo Park, CA (US); R Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 252 days.

(21) Appl. No.: 12/753,715

(22) Filed: Apr. 2, 2010

(65) Prior Publication Data

US 2011/0240952 A1 Oct. 6, 2011

(51) Int. Cl.
*H01L 29/06* (2006.01)

(52) U.S. Cl. .................................. 257/5; 257/4

(58) Field of Classification Search .................. 257/5, 4
See application file for complete search history.

(56) References Cited

U.S. PATENT DOCUMENTS

| | | | |
|---|---|---|---|
| 5,912,839 A | 6/1999 | Ovshinsky et al. | |
| 6,850,429 B2 | 2/2005 | Rinerson et al. | |
| 6,927,430 B2 | 8/2005 | Hsu | |
| 7,629,694 B2 | 12/2009 | Mouttet | |
| 2007/0114508 A1* | 5/2007 | Herner et al. | 257/2 |
| 2008/0239787 A1* | 10/2008 | Herner | 365/148 |
| 2009/0001342 A1* | 1/2009 | Schricker et al. | 257/4 |
| 2009/0163826 A1 | 6/2009 | Mouttet | |
| 2011/0227024 A1* | 9/2011 | Sekar et al. | 257/4 |

OTHER PUBLICATIONS

"Programmable Electronics using Memristor Crossbars—Memristors and Artificial Intelligence," http://knol.google.com/k/programmable-electronics-using-memristor-crossbars#Memristors and Artificial Intelligence, Apr. 2, 2010.

* cited by examiner

*Primary Examiner* — Long Tran

(57) ABSTRACT

A programmable crosspoint device with an integral diode includes a first crossbar, a second crossbar, a metallic interlayer, and a switching oxide layer interposed between the first crossbar and the metallic interlayer. The switching oxide layer has a low resistance state and high resistance state. The programmable crosspoint device also includes an integral diode which is interposed between the second crossbar layer and the metallic interlayer, the integral diode being configured to limit the flow of leakage current through the programmable crosspoint device in one direction. A method for forming a programmable crosspoint device with an integrated diode is also provided.

11 Claims, 6 Drawing Sheets

PROGRAMMABLE CROSSPOINT DEVICE WITH AN INTEGRAL DIODE

STATEMENT OF GOVERNMENT INTEREST

This invention has been made with government support. The government has certain rights in the invention.

BACKGROUND

Nanoscale electronics promise a number of advantages including significantly reduced feature sizes and the potential for self-assembly or other relatively inexpensive, non-photolithography-based fabrication methods. Nanowire crossbar arrays can be used to form a variety of electronic circuits and devices, including ultra-high density nonvolatile memory. Programmable crosspoint devices can be interposed between nanowires at intersections where two nanowires overlay each other. These programmable crosspoint devices can be programmed to maintain two or more conduction states. For example, the programmable crosspoint devices may have a first low resistance state and a second higher resistance state. Data can be encoded into these programmable crosspoint devices by selectively setting the state of the crosspoint devices within the nanowire array. The state of a target crosspoint device can be read by applying a voltage across the target crosspoint device and measuring the current which passes through the target crosspoint device. However, leakage currents which pass through other paths can obscure the current passing through the target crosspoint device. Reducing these leakage currents within the nanowire array can yield significant operational and manufacturing advantages.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
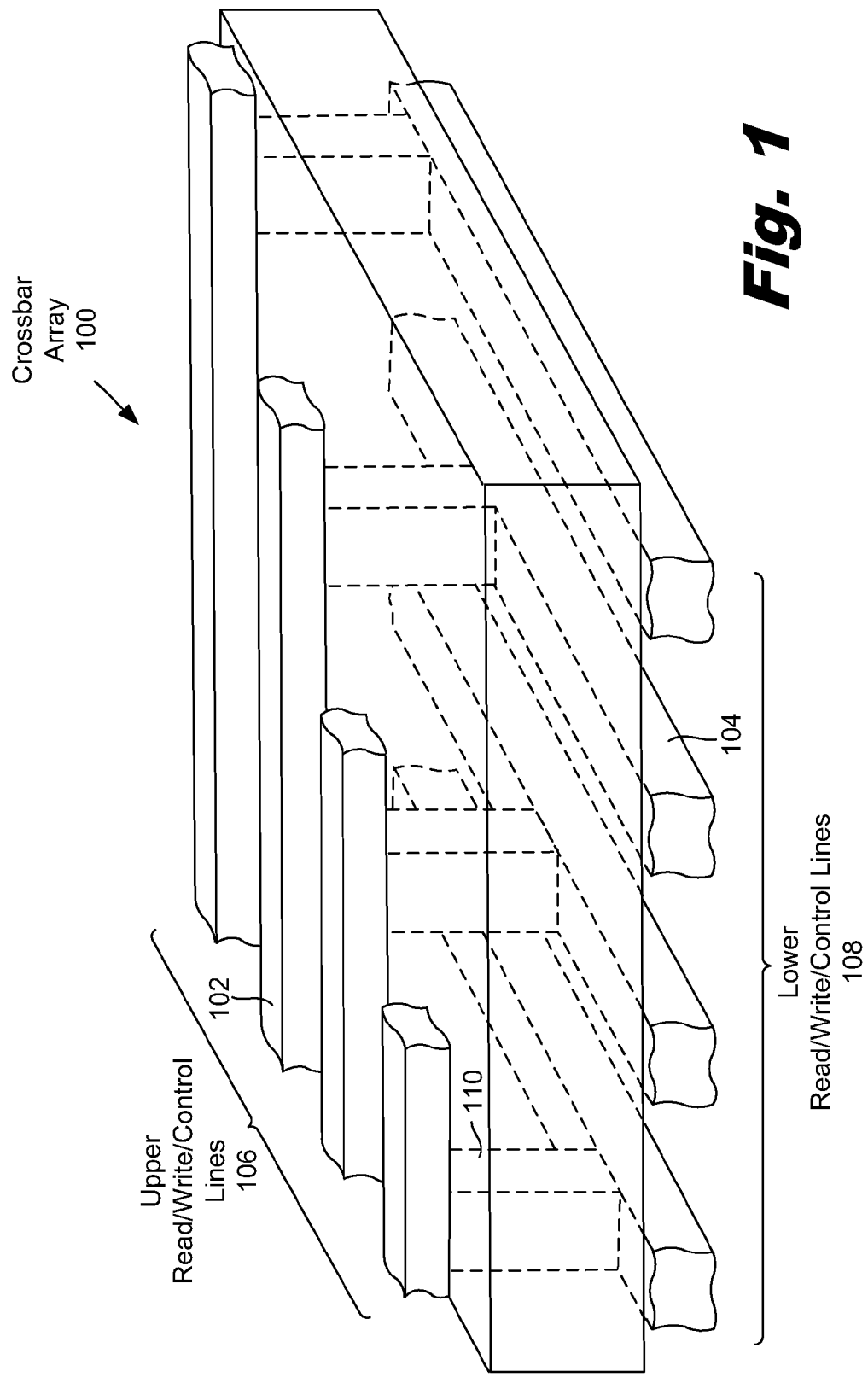
FIG. 1 is an isometric view of an illustrative nanowire crossbar architecture incorporating programmable crosspoint devices, according to one embodiment of principles described herein.

One particularly promising family of nanoscale devices incorporates a crossbar architecture. Studies of switching in nanometer-scale crossed-wire devices have previously reported that these devices could be reversibly switched and may have an "on-to-off" conductance ratio of ~$10^3$. These devices have been used to construct crossbar circuits and provide a promising route for the creation of ultra-high density nonvolatile memory. Additionally, the versatility of the crossbar architecture lends itself to the creation of other communication and logic circuitry. For example, new logic families may be constructed entirely from crossbar arrays of switches or from hybrid structures composed of switches and transistors. These devices have the potential to dramatically increase the computing efficiency of CMOS circuits. These crossbar circuits could replace CMOS circuits in some circumstances and enable performance improvements of orders of magnitude without having to further shrink transistors.

The design and manufacture of nanoscale electronic devices presents a number of challenges which are being addressed to improve commercial production of nanoscale electronic devices and incorporate these devices into microscale and larger-scale systems, devices, and products.

One of these challenges is leakage current. As discussed above, these programmable crosspoint devices can be programmed to maintain two or more conduction states. For example, the programmable crosspoint devices may have a first low resistance state and a second higher resistance state. Data can be encoded into these programmable crosspoint devices by selectively setting the state of the programmable crosspoint devices within the nanowire array. The state of a target programmable crosspoint device can be read by applying a voltage across the target programmable crosspoint device and measuring the current which passes through the target crosspoint. However, leakage currents which pass through other paths can obscure the current passing through the target crosspoint. Reducing these leakage currents within the nanowire array can yield significant operational and manufacturing advantages.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout the specification, a conventional notation for the flow of electrical current is used. Specifically, the direction of a flow of positive charges ("holes") is from the positive side of a power source to the more negative side of the power source.

FIG. 1 is an isometric view of an illustrative nanowire crossbar array (100). The crossbar array (100) is composed of a first layer of approximately parallel nanowires (108) that are overlain by a second layer of approximately parallel nanowires (106). The nanowires of the second layer (106) are roughly perpendicular, in orientation, to the nanowires of the first layer (108), although the orientation angle between the layers may vary. The two layers of nanowires (106,108) form a lattice, or crossbar, each nanowire of the second layer (106) overlying all of the nanowires of the first layer (108) and coming into close contact with each nanowire of the first layer (108) at nanowire intersections that represent the closest contact between two nanowires.

Although individual nanowires (102, 104) in FIG. 1 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers may be fabricated using a variety of techniques including conventional photolithography as well as mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

At nanowire intersections, nanoscale electronic components, such as resistors, and other familiar basic electronic components, can be fabricated to interconnect two overlapping nanowires. In this example, programmable crosspoint devices (110) are disposed between a first layer of approximately parallel nanowires (108) and a second layer of approximately parallel nanowires (106). These programmable crosspoint devices (110) may perform a variety of functions including providing programmable switching between the nanowires. For purposes of illustration, only a few of the programmable crosspoint devices (110) are shown in FIG. 1. As discussed above, it can be desirable in many devices for a programmable crosspoint device to be present at each nanowire intersection. Because every wire in the first layer of nanowires (108) intersects each wire in the second layer of nanowires (106), placing a programmable crosspoint device at each intersection allows for any nanowire in the first layer (108) to be connected to any wire in the second layer (106).

According to one illustrative embodiment, the nanowire crossbar architecture (100) may be used to form a nonvolatile memory array. Each of the programmable crosspoint devices (110) may be used to represent one or more bits of data. For example, in the simplest case, a programmable crosspoint device (110) may have two states: a conductive state and a nonconductive state. The conductive state may represent a binary "1" and the nonconductive state may represent a binary "0", or visa versa. Binary data can be written into the crossbar architecture (100) by changing the conductive state of the programmable crosspoint devices. The binary data can then be retrieved by sensing the state of the programmable crosspoint devices (110).

The example above is only one illustrative embodiment of the nanowire crossbar architecture (100). A variety of other configurations could be used. For example, the crossbar architecture (100) can incorporate programmable crosspoint devices which have more than two states. In another example, crossbar architecture can be used to form implication logic structures and crossbar based adaptive circuits such as artificial neural networks.

Figure 2A:
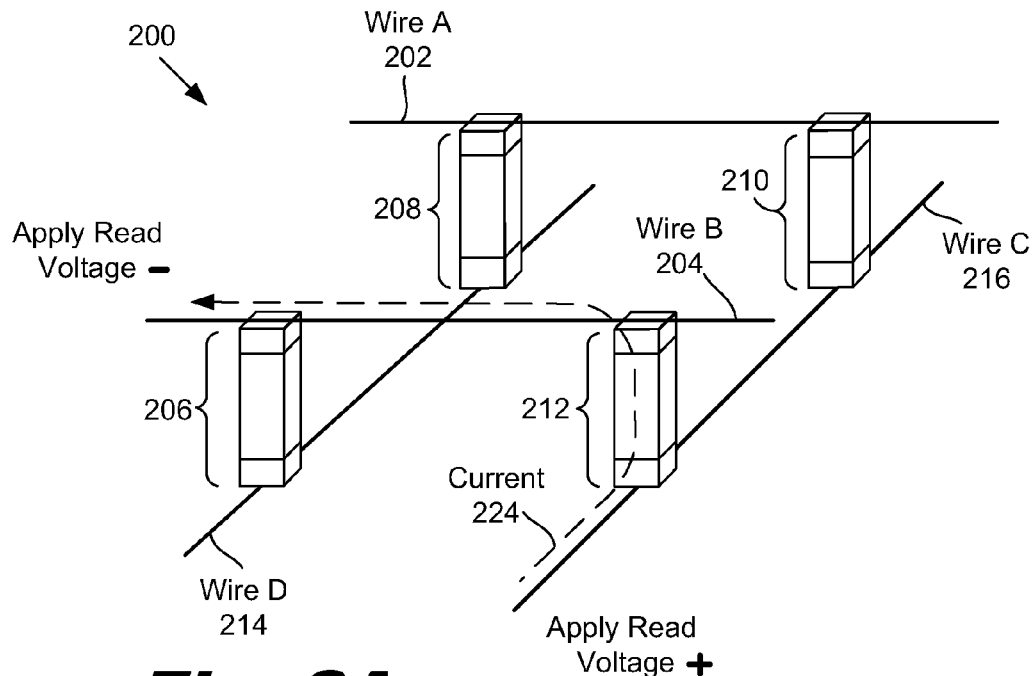
FIGS. 2A and 2B are diagrams which show illustrative current paths through a portion of a crossbar memory array, according to one embodiment of principles described herein.

FIG. 2A is diagram which shows an illustrative crossbar architecture (200). For purposes of illustration, only a portion of the crossbar architecture (200) has been shown and the nanowires (202, 204, 214, 216) have been shown as lines. Nanowires A and B (202, 204) are in an upper layer of nanowires and nanowires C and D (214, 216) are in a lower layer. Crosspoints (206-212) connect the various nanowires at their intersections.

According to one illustrative embodiment, the state of a target crosspoint (212) between wire B (204) and wire C (216) can be read by applying a negative (or ground) read voltage to wire B (204) and a positive voltage to wire C (216). Ideally, if a current (224) flows through the crosspoint (212) when the read voltages are applied, the reading circuitry can ascertain that the crosspoint (212) is in its conductive state. If no current, or an insubstantial current, flows through the crosspoint (212), the reading circuitry can ascertain that the crosspoint (212) is in its resistive state.

However, if the crosspoints (206-210) are purely resistive in nature (i.e. a low resistance is a conductive state and a high resistance is a resistive state) a number of leakage currents can also travel through other paths. These leakage currents can be thought of as "electrical noise" which obscures the desired reading of the crosspoint (212)

Figure 2B:
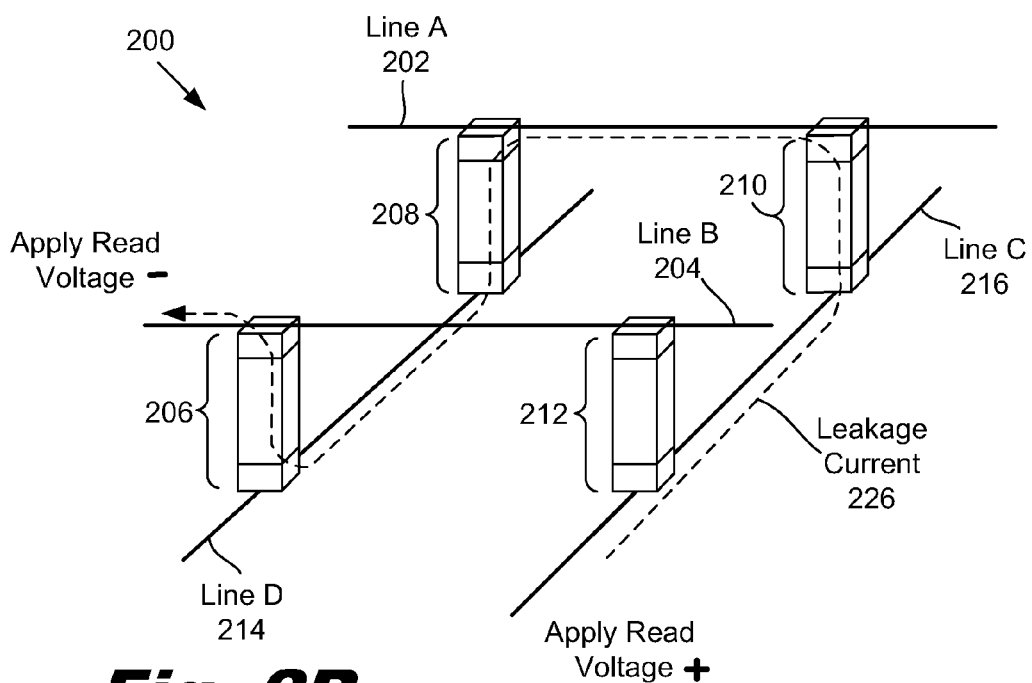

FIG. 2B shows a leakage current (226) which travels through an alternative path between wire C (216) and wire B (204). FIG. 2B, the leakage current (226) travels through three crosspoints (210, 208, 206) and is present on line B (204). As can be imagined, in an array of greater size than that illustrated in FIG. 2B, various leakage currents could travel through a large number of alternative paths and be present on line B (204) when it is sensed by the reading circuitry. These leakage currents can produce a significant amount of undesirable current which obscures the desired reading of the state of the crosspoint (212).

Figure 3A:
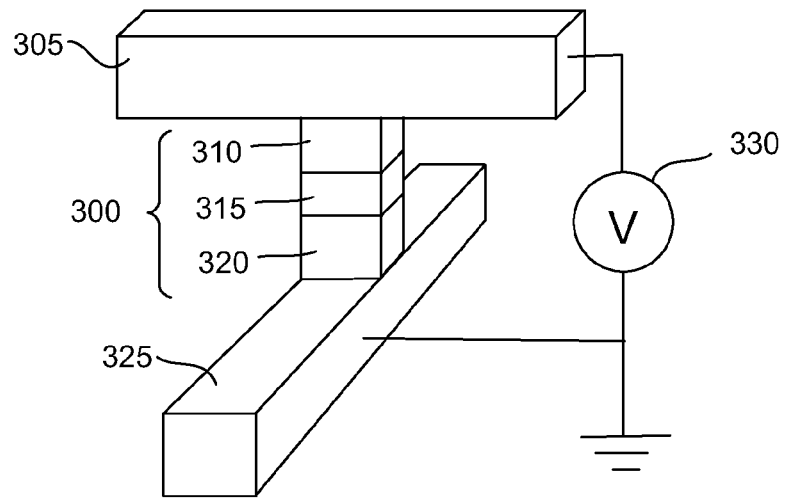
FIGS. 3A and 3B are diagrams of an illustrative programmable crosspoint device which includes an integral diode, according to one embodiment of principles described herein.

FIG. 3A is a diagram of an upper crossbar (305) and an intersecting lower crossbar (325) with a programmable crosspoint device (300) interposed between the upper crossbar (305) and the lower crossbar (325). The programmable crosspoint device (300) includes a switching oxide layer (310), a metallic interlayer (315) and a transition metal oxide diode (320) which forms a diode. The transition metal oxide diode (320) may have an amorphous, crystalline or poly crystalline material. For example, the transition metal oxide diode (320) may be formed from crystalline titanium oxide diode or from amorphous silicon. As discussed above, a voltage (330) may be applied to the crossbars (305, 325). The magnitude and polarity of the voltage (330) may be adjusted to suit the particular circumstances. For example, during a write operation, a relatively high voltage may be applied to one or more of the crossbars (305, 325). This relatively high voltage allows the state of the programmable crosspoint device (300) to be changed. During reading operations, the voltage (330) may be much lower. In the illustrative embodiment shown in FIG. 3A, the voltage (330) is applied to the upper crossbar (305) and the lower crossbar (325) is grounded.

Figure 3B:
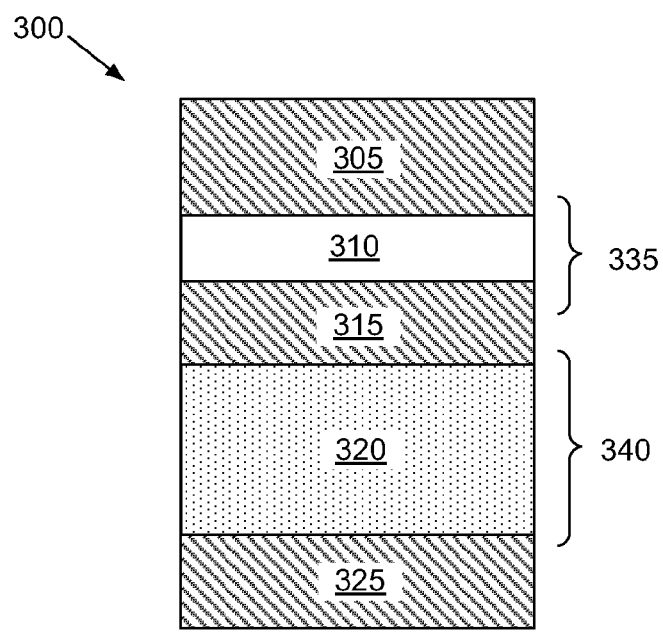

FIG. 3B is a cross-sectional diagram of the programmable crosspoint device (300). According to one illustrative embodiment, the programmable crosspoint device (300) is constructed from the bottom up. First, the lower crossbar (325) is formed. On top of the lower crossbar (325), a layer of crystalline titanium dioxide layer (320) is formed. The crystalline titanium dioxide (320) may be formed in a variety of ways, including chemical vapor deposition and atomic layer deposition. Atomic layer deposition is a thin film deposition technique that is based on the sequential use of two precursors. Typically the target substrate is exposed a first precursor gas, which binds or reacts with the substrate surface to form a very thin layer. The first precursor gas is then purged and a second precursor gas is brought into contact with the substrate. The second precursor gas interacts with the thin layer formed by the first precursor. Because these reactions are limited to the exposed surface and deposit a known thickness of material for each cycle, atomic layer deposition can be used to produce layers with very precise and uniform thicknesses. The thickness of the layer can be controlled at the angstrom level by adjusting the number of cycles.

According to one illustrative embodiment, the crystalline titanium dioxide layer (320) may be formed using atomic layer deposition with a process temperature of approximately 400° C. This temperature creates a poly-crystalline structure in the crystalline titanium dioxide layer (320). As used in the specification and appended claims, the term "crystalline" can be used to refer to any solid material whose constituent atoms, molecules, or ions are arranged in an orderly repeating pattern which extends in all three spatial dimensions at some length scale. As such, the term "crystalline" can refer to layers or materials which exhibit conventional crystalline, polycrystalline, polymorphic, allotropic, or quasi-crystalline structures. The term "crystalline" does not preclude dopants, point defects, grain boundaries, dislocations, or other crystallographic defects.

As discussed above, the thickness of the crystalline titanium dioxide layer (320) may be adjusted by exposing the substrate to the desired number of cycles of precursor gases. According to one illustrative embodiment, the thickness of the crystalline titanium dioxide layer may be from 10 nanometers to 100 nanometers. For example, the crystalline titanium dioxide layer (320) may be 40 nanometers thick. The crystalline titanium dioxide layer (320) may include a number of impurities. For example, the inclusion of oxygen vacancies can be used to increase the electrical conductivity of the crystalline titanium dioxide layer (320).

Above the crystalline titanium dioxide layer (320), a metallic interlayer (315) is deposited. This metallic layer (315) is not used to form an external electrical connection to the programmable crosspoint device (300). Instead the metallic interlayer (315) forms an interface between the crystalline titanium dioxide layer (320) and the switching oxide layer (310). First, the metallic interlayer (315) may serve as a barrier between the crystalline titanium dioxide layer (320) and the overlying switching oxide layer (310). This barrier prevents the diffusion of dopants or other contaminants between the two layers (310, 320).

Second, the metallic interlayer (315) may average the electrical properties of the layers above and below it. For example, if the programmable crosspoint device (300) has a cross-sectional area of 50 nanometers by 50 nanometers, one portion the crystalline titanium dioxide layer (320) may have a high electrical conductivity due to dopants trapped at a particular grain boundary while the remainder of the layer (320) has a lower electrical conductivity. The metallic interlayer (315) is electrically connected over the entire upper surface of the crystalline titanium dioxide layer and consequently averages out the electrical conductivity of the crystalline layer. Third, the metallic interlayer (315) ensures that there is a good electrical connection made between the whole upper surface of the crystalline titanium dioxide layer (320) and the whole lower surface of the switching oxide layer (310). Fourth, the metallic interlayer (315) can be used to create a rectifying interface with the crystalline titanium dioxide layer (320). This illustrative embodiment is discussed below with reference to FIG. 4A. Alternatively, the interface between the metallic interlayer (315) and the titanium dioxide layer (320) could be Ohmic and the interface between the titanium dioxide layer and the bottom platinum layer could be rectifying. This illustrative embodiment is discussed below with reference to FIG. 4B.

Over the metallic interlayer (315), a switching oxide layer (310) is formed. This switching oxide layer (310) may be formed from a variety of materials including titanium dioxide. According to one illustrative embodiment, this layer may be deposited using atomic layer deposition. For example, a switching oxide layer (310) with a thickness of between 3 to 15 nanometers may be deposited using atomic layer deposition with a process temperature of approximately 300° C. This may produce an amorphous form of titanium oxide which has the desired characteristics. Over the switching oxide layer (310), the upper crossbar (305) is deposited.

The switch (335) is made up of the switching oxide layer (310) and its interfaces with the metallic interlayer (315) and the upper crossbar (305). The titanium oxide which makes up the switching oxide layer (310) is configured to serve as a matrix which contains mobile dopants. These mobile dopants have a voltage threshold for motion. When a voltage which exceeds the voltage threshold is applied across the switching oxide layer (310), the mobile dopants move through the titanium dioxide matrix to a new location. This can alter the electrical resistance of the switching oxide layer (310).

A reading voltage which is lower than the voltage threshold can be applied across the switch (335) to measure its resistive state. The reading voltage is not great enough to produce significant motion of the mobile dopants. Consequently, the switch (335) can be read multiple times without altering its resistive state. For example, when the switch (335) is in a highly resistive state, the reading voltage would produce a relatively small amount of current through the switch (335). When the switch (335) is in a low resistance state, the reading voltage produces a larger current through the switch (335).

As discussed above, leakage currents through surrounding crosspoint devices can obscure the measurement of the resistive state of a target crosspoint device. Consequently, it can be desirable to limit the flow of electrical current through the crosspoint devices (300) in one direction. Referring back to FIGS. 2A and 2B, the reading current (224) for all crosspoint devices flows only one direction. As illustrated in FIG. 2A, the reading current flows upward through the crosspoint devices. As shown in FIG. 2B, the leakage current (226) must flow downward through at least one crosspoint device (208) to return to line B. By forming an integral diode in each of the crosspoint devices, the backward flow of electrical current through the crosspoint devices can be significantly reduced. This limits the leakage current and improves the functionality of the crossbar array. For example, the crossbar array could be larger because the increase in potential leakage paths created by enlarging the array is offset by the diodes which block reverse currents.

In the illustrative embodiment shown in FIGS. 3A and 3B, the diode (340) includes the crystalline titanium dioxide layer (320) and its interfaces with the metallic interlayer (315) and the lower crossbar (325). According to one illustrative embodiment, the crystalline titanium dioxide layer (320) contains a relatively high level of dopants and consequently has a relatively low electrical resistance.

Figure 4A:
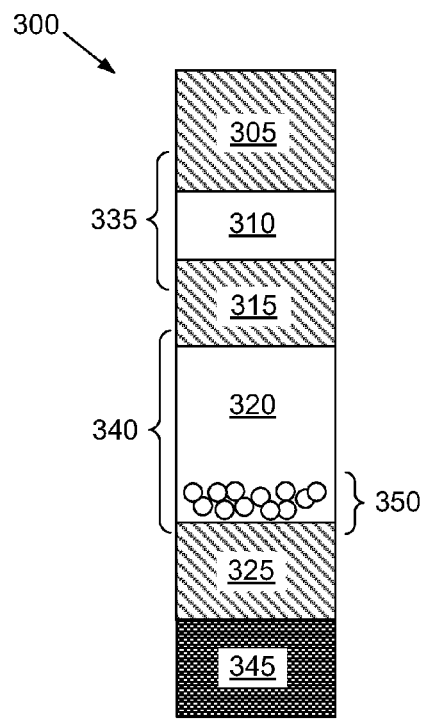
FIGS. 4A and 4B are diagrams of illustrative programmable crosspoint devices which include an integral diode, according to one embodiment of principles described herein.
Figure 4A:
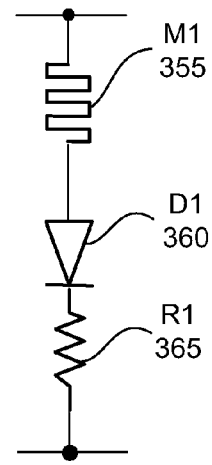
Figure 4B:
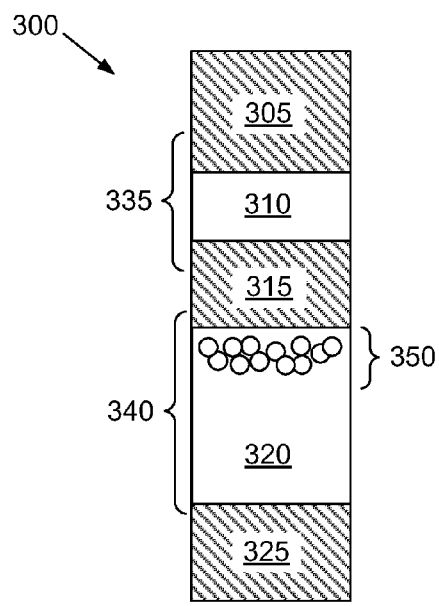
Figure 4B:
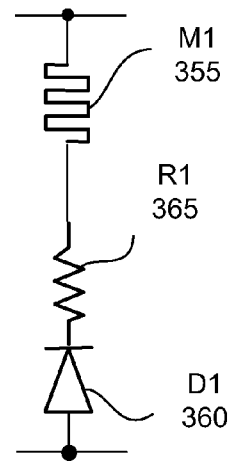

FIGS. 4A and 4B show illustrative embodiments of the programmable crosspoint device (300) which contains an integral diode (340). The electrical characteristics of the diode (340) are determined by the location of the dopant concentration (350) within the crystalline titanium oxide layer (320). For example, in the illustrative embodiment shown in FIG. 4A, the dopant concentration (350) is in proximity to the lower crossbar (325). This creates an Ohmic interface between the crystalline titanium oxide layer (320) and the lower crossbar. An Ohmic interface is a low resistance interface which allows electrical currents to pass across the interface relatively easily. In this embodiment, the dopant concentration (350) has been created by introducing a titanium layer (345) below the lower crossbar (325). The titanium layer (345) can diffuse upward through the lower crossbar (325) and come into contact with the crystalline titanium oxide layer (320). This diffused titanium has a high affinity for oxygen atoms and "steals" oxygen atoms out of the crystalline titanium dioxide layer (320). This creates oxygen vacancies in the crystalline titanium oxide layer (320). These oxygen vacancies are dopants which form the dopant concentration (350) and create the Ohmic interface between the crystalline titanium oxide layer (320) and the lower crossbar (325).

The interface between the crystalline titanium oxide layer (320) and the metallic interlayer (315) has few oxygen vacancy dopants and exhibits rectifying behavior. Specifically, this upper interface allows relatively unimpeded current flow from the top crossbar (305) to the bottom crossbar (325), but blocks current flowing in the reverse direction.

To the right of the cross sectional diagram of the programmable crosspoint device (300), an electrical schematic is shown. The resistor R1 (365) represents the resistance of the crystalline layer (320) and its bottom interface with the lower crossbar (325). The diode D1 (360) represents the rectifying behavior of the upper interface. The memristor M1 (355) represents the programmable resistance of the switch (335). For purposes of illustration, the very low resistances of the metallic layers (305, 315, 325) have not been illustrated.

Similarly, FIG. 4B shows a cross sectional diagram of a programmable crosspoint device (300) on the left and a corresponding electrical diagram on the right. In this illustrative embodiment, the dopant concentration (350) is at the upper interface of the crystalline titanium oxide layer (320) and the lower interface exhibits rectifying behavior. This reverses the diode direction and allows the current to flow from bottom crossbar to the upper crossbar but blocks it in the opposite direction. This dopant concentration (350) could be created by placing a thin layer of titanium between the metallic interlayer (315) and the crystalline layer (320). As discussed above, the titanium has a high affinity for oxygen and will draw oxygen atoms out of the crystalline layer (320) to create the dopant concentration (350).

As discussed above, the resistance R1 (365) of the crystalline layer (320) is relatively low compared to the resistance of the memristor M1 (355). For a given current, the voltage drop across a resistor is proportional to the electrical resistance of the resistor. When two resistances are in series, they create a voltage divider. In a voltage divider, the voltage across each of the resistors is proportional to their resistance. For example, a voltage of 4 volts is applied across two resistors in series, with the first resistor having a 1 Ohm resistance and the second resistor having a 3 Ohm resistance. The voltage drop across the 1 Ohm resistor is 1 volt and the voltage across the 3 Ohm resistor is 3 volts. In the programmable crosspoint device (300) it is desirable that the voltage drop is primarily across the switching oxide layer (310). During programming, the voltage drop across the switching oxide layer (310) creates the electrical field which moves the mobile dopants. During reading, it is desirable that the switching oxide layer (310) be the primary factor in how much current flows through the device. For at least these reasons, it is desirable that the crystalline titanium oxide layer (320) have a low electrical resistance. This low electrical resistance can be created in a number of ways including adding dopants to the crystalline layer (320). The dopant concentration (350) and concentration (350) and these additional dopants are not mobile within the crystalline layer (320) under normal operating conditions. Consequently, the characteristics of the crystalline layer (320) remain substantially unchanged during the operation of the programmable crosspoint device.

A switching oxide layer (310) may be deposited using a number of techniques including atomic layer deposition. For example, the atomic layer deposition may be performed at 300° C. and produce a layer thickness of between 3 nm and 15 nm. According to one illustrative embodiment, the thickness of the switching oxide layer (310) may be 5 nm.

Figure 5A:
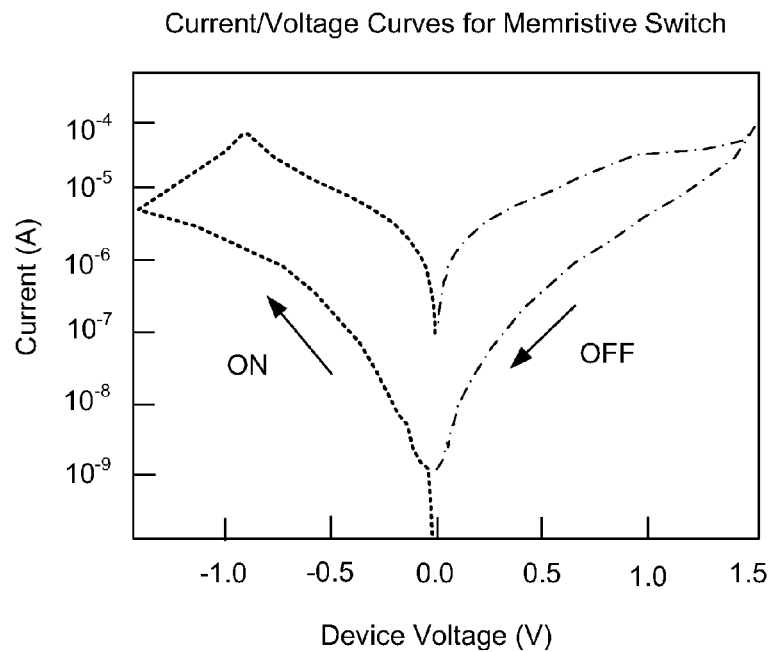
FIGS. 5A and 5B are illustrative graphs of the electrical behavior of a programmable crosspoint device which includes an integral diode, according to one embodiment of principles described herein.
Figure 5B:
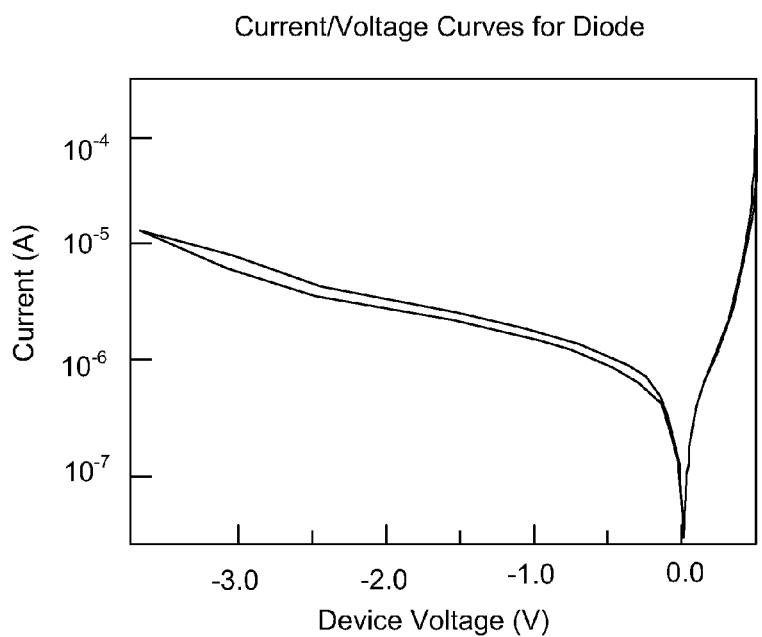

FIGS. 5A and 5B are current voltage curves for the switch (335, FIG. 4A) and the diode (340, FIG. 4A) respectively. In both graphs, the device voltage (V) is shown on the horizontal axes of the graphs and the current in amps is shown on the vertical axes. FIG. 5A illustrates the application of a programming voltage across a switch (335, FIG. 4A). The switch (335, FIG. 4A) which was tested included a platinum top crossbar and a platinum metal layer, with a titanium dioxide switching oxide layer (310, FIG. 4A) interposed between metal layers. The cross sectional area of the switch (335, FIG. 4A) was 50 nanometers by 50 nanometers. The switching oxide layer (310) was deposited using atomic layer deposition at 300° C. and had a thickness of 5 nanometers.

To turn the switch (335, FIG. 4A) to an "ON" state a voltage is applied to move the mobile dopants within the switching oxide layer (310, FIG. 4A) and reduce the electrical resistance of the switching oxide layer (310, FIG. 4A). In this case, the programming voltage which changes the state of the switching oxide layer (310, FIG. 4A) to the "ON" state is illustrated in FIG. 5A as a dotted line which loops to the left. The dotted line exhibits hysteresis which demonstrates that the switching oxide layer (310, FIG. 4A) has changed states. For example, as the negative programming voltage is beginning to be applied, a negative voltage of −0.5 volts results in only $10^{-7}$ amps of electrical current flowing through the switching oxide layer (310, FIG. 4A). However, after the maximum programming voltage has been applied, a negative voltage of −0.5 volts results in $10^{-5}$ amps of current flowing through the switching oxide layer (310, FIG. 4A). This is a change of two orders of magnitude and indicates that the mobile dopants have shifted so that the switching oxide layer (310, FIG. 4A) has a lower electrical resistance.

The application of a positive voltage to the switch (335, FIG. 4A) is shown as a dash/dot line which extends to the right. This loop also exhibits hysteresis. As the positive voltage is initially applied, relatively high currents flow through the switch (335, FIG. 4A). However, as the mobile dopants shift within the switching oxide layer (310, FIG. 4A), the resistance of the switch (335, FIG. 4A) is reduced and the current levels drop. For example, when the positive voltage is initially applied, a 0.5 voltage results in $10^{-5}$ amps of electrical current flowing through the switching oxide layer (310, FIG. 4A). However, after the maximum positive programming voltage has been applied, a positive voltage of 0.5 volts results only in $10^{-7}$ amps of current flowing through the switching oxide layer (310, FIG. 4A). This is a change of two orders of magnitude and indicates that the mobile dopants have shifted so that the switching oxide layer (310, FIG. 4A) has returned to its higher resistance state.

FIG. 5B shows the current/voltage curves for the diode (340, FIG. 3B). The diode (340, FIG. 3B) which was tested included a platinum lower crossbar (325, FIG. 3B) and a platinum metallic interlayer (315, FIG. 3B) with a crystalline titanium dioxide layer (320, FIG. 3B) interposed between the two platinum layers. The crystalline titanium dioxide layer (320, FIG. 3B) was deposited using atomic layer deposition at 400° C. and had an area of 50 nanometers by 50 nanometers and a thickness of 50 nanometers.

An application of a positive voltage across the diode (340, FIG. 3B) results in the rapid rise in the current through the diode (340, FIG. 3B). For example, an application of 0.5 volts results in a current of $10^{-4}$ amps. This indicates that in the forward direction, the diode (340, FIG. 3B) has a lower resistance than the switching oxide layer (310, FIG. 3B). However, in the reverse direction, the diode (340, FIG. 3B) has a much higher electrical resistance as indicated by the lower currents when a negative voltage is applied. For example, when −0.5 volts is applied, only $10^{-6}$ amps flow through the diode (340, FIG. 3B). This diode is robust and has a large enough rectification to limit the leakage current in the crossbar and also allows high enough currents to pass through for the programming voltage to change the state of the switch (335, FIG. 3B). Significantly, the electrical behavior of the diode (340, FIG. 3B) exhibits very little hysteresis, which indicates that the electrical characteristics of the diode (340, FIG. 3B) are substantially stable.

As used in the specification and appended claims, the term "forward resistance" refers to the resistance of a diode to the flow of electrical current in the direction in which the diode has the lowest electrical resistance. As shown in FIG. 5B, the flow of electrical current when a positive voltage is applied to the diode (340, FIG. 3B) has a low or forward resistance. As used in the specification and appended claims, the term "reverse resistance" refers to the resistance of the diode in the blocking direction. For example, applying a negative voltage to the diode in FIG. 5B results in the reverse resistance limiting the current flow through the diode (340, FIG. 3B).

Figure 6:
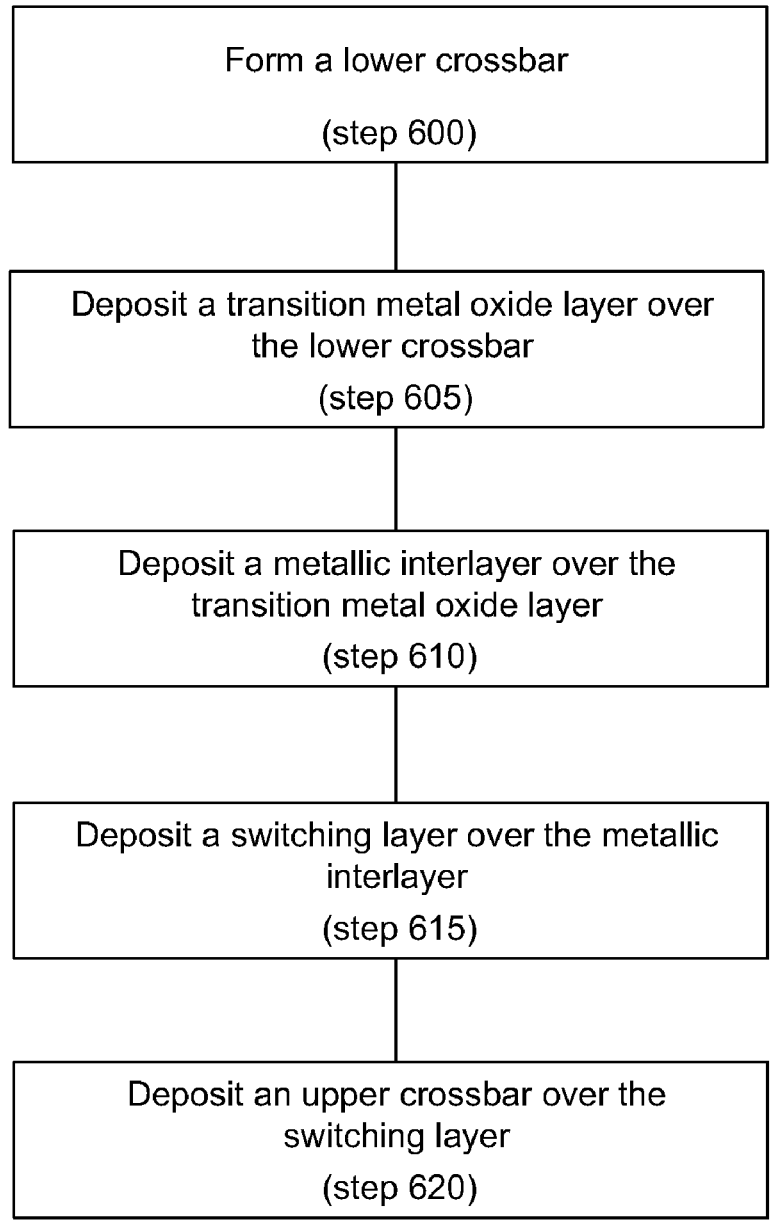
FIG. 6 is a flow chart of one illustrative method for forming a programmable crosspoint device with an integral diode, according to one embodiment of principles described herein.

FIG. 6 is a flowchart of one illustrative method for forming a programmable crosspoint device with an integral diode. In this illustrative embodiment, a lower crossbar is formed (step 600) and a transition metal oxide layer is deposited (step 605) over the lower crossbar using any standard deposition. For example, the transition metal oxide layer may be crystalline titanium dioxide which is deposited using atomic layer deposition with a process temperature of approximately 400° C. A metallic interlayer is formed over the transition metal oxide layer (step 610) and a switching oxide layer is deposited over the metallic interlayer (step 615) using atomic layer deposition with a process temperature of approximately 300° C. The upper crossbar is deposited over the switching oxide layer (step 620).

A variety of other steps could be included in the method. For example, a titanium layer could be formed in proximity to the crystalline titanium dioxide layer to create a dopant concentration at an interface of the crystalline titanium dioxide layer. As discussed above, this dopant concentration creates an Ohmic connection at the interface. Additionally, a variety of dopants could be deposited in the switching oxide layer. For example, ion implantation could be used to accurately place a desired concentration of mobile dopants in the switching oxide layer.

The examples given above are only illustrative embodiments of a programmable crosspoint device with an integral diode. A variety of other embodiments could also be used. For example, the dimensions and material of the programmable crosspoint device could be altered to achieve the desired performance. Additionally, the methods of constructing the programmable crosspoint device could be changed to reduce the cost or produce higher quality results. For example, the atomic layer deposition process could be replaced by the chemical vapor deposition or another process.

The design requirements for the programmable crosspoint device are influenced by a variety of factors. For example, the size of the crossbar array, the material composition of the switching oxide layer, the mobile dopant species, the size of the crossbars, the robustness of the reading and writing circuitry, and other factors could influence the amount of allowable leakage current. In some embodiments, design requirements may dictate that the diode must reduce the leakage currents by one order of magnitude, two orders of magnitude, or more so that design is functional.

Additionally, the design requirements may also include limits on the resistance of the diode. For example, design requirements may specify limits on the resistance of the diode in both the forward and reverse directions. These limits could be expressed in absolute terms or in relation to the resistance of the switch in its low or high resistance state. According to one illustrative embodiment, the forward resistance of the diode is no more than one half of the resistance of the switch in its lowest resistance configuration.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A programmable crosspoint device with an integral diode comprises:
   a first crossbar ;
   a second crossbar;
   a metallic interlayer;
   a switching oxide layer interposed between the first crossbar and the metallic interlayer, the switching oxide layer having a low resistance state and high resistance state; and
   an integral diode being interposed between the second crossbar layer and the metallic interlayer, the integral diode including a crystalline titanium oxide layer having a dopant concentration defining an Ohmic interface at one of the second crossbar layer or the metallic interlayer, the crystalline titanium oxide layer defining a rectifying interface at the other of the second crossbar layer or the metallic interlayer, the integral diode being configured to limit the flow of leakage current through the programmable crosspoint device in one direction.

2. The device of claim 1, in which the first crossbar layer, the second crossbar layer, and the metallic interlayer comprise platinum.

3. The device of claim 1, in which the switching oxide layer comprises a titanium oxide matrix and mobile dopants, the mobile dopants moving within the titanium oxide matrix to alter the state of the switching oxide layer.

4. The device of claim 1, in which the crystalline titanium oxide layer is an atomic layer deposited layer.

5. The device of claim 1, in which the integral diode has a thickness which is approximately 5 times the thickness of the switching oxide layer.

6. The device of claim 1, in which the switching oxide layer has a thickness between 3 and 15 nanometers.

7. The device of claim 6, in which the integral diode has a thickness between 15 and 75 nanometers.

8. The device of claim 1, in which the dopant concentration comprises oxygen vacancies.

9. The device of claim 8, further comprising a titanium layer in proximity to the crystalline titanium oxide layer, titanium atoms from titanium layer migrating though the second crossbar layer and into the crystalline titanium diode to form oxygen vacancies at a bottom interlace of the crystalline titanium oxide layer.

10. The device of claim 1, in which the integral diode has a forward electrical resistance and a reverse electrical resistance: the forward electrical resistance being less than half of an electrical resistance of the switching oxide layer in its low resistance state.

11. The device of claim 1, in which the integral diode has a current capacity which is greater than a current produced by a programming voltage across he switching oxide layer.

* * * * *

UNITED STATES PATENT AND TRADEMARK OFFICE
CERTIFICATE OF CORRECTION

PATENT NO. : 8,207,520 B2  
APPLICATION NO. : 12/753715  
DATED : June 26, 2012  
INVENTOR(S) : Jianhua Yang et al.

Page 1 of 1

It is certified that error appears in the above-identified patent and that said Letters Patent is hereby corrected as shown below:

In column 10, line 14, in Claim 1, delete "crossbar ;" and insert -- crossbar; --, therefor.

In column 10, line 49, in Claim 9, delete "though" and insert -- through --, therefor.

In column 10, line 51, in Claim 9, delete "interlace" and insert -- interface --, therefor.

In column 10, lines 54-55, in Claim 10, delete "resistance:" and insert -- resistance; --, therefor.

In column 10, line 60, in Claim 11, delete "he" and insert -- the --, therefor.

Signed and Sealed this  
Twenty-second Day of January, 2013

David J. Kappos  
*Director of the United States Patent and Trademark Office*